(12) United States Patent
Ninomiya et al.

(10) Patent No.: US 7,335,949 B2
(45) Date of Patent: Feb. 26, 2008

(54) SEMICONDUCTOR DEVICE AND METHOD OF FABRICATING THE SAME

(75) Inventors: Hitoshi Ninomiya, Kawasaki (JP); Yoshinao Miura, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/320,950

(22) Filed: Dec. 30, 2005

(65) Prior Publication Data

US 2006/0151831 A1    Jul. 13, 2006

(30) Foreign Application Priority Data

Jan. 11, 2005    (JP)    ............ 2005-003803

(51) Int. Cl.
*H10L 29/94*    (2006.01)
(52) U.S. Cl. .............. 257/341; 257/328; 257/331; 257/339; 257/E29.013
(58) Field of Classification Search ........... 257/565, 257/330, 135, 136, 242, 329, 331, 341, E29.118, 257/E29.274, E29.313, E29.318, 328, E29.013, 257/E29.027, E29.198, E29.257
See application file for complete search history.

(56) References Cited

U.S. PATENT DOCUMENTS 6,724,042 B2 *    4/2004    Onishi et al. ............ 257/341

2002/0074596 A1 *    6/2002    Suzuki et al. ............ 257/330

FOREIGN PATENT DOCUMENTS

| JP | 2001-135819 | 5/2001 |
| JP | 2003-273355 | 9/2003 |

* cited by examiner

*Primary Examiner*—Long K. Tran
(74) *Attorney, Agent, or Firm*—Young & Thompson

(57) ABSTRACT

A semiconductor device 100 includes an element-forming region having gate electrode 108 formed therein, and a circumferential region formed in the outer circumference of the element-forming region and having an element-isolating region 118 formed therein. On the main surface of the semiconductor substrate 101, there is formed a parallel pn layer having an N-type drift region 104 and P-type column regions 106 alternately arranged therein. In the circumferential region, there is formed a field electrode 120, but the field electrode 120 is not formed on the P-type column regions 106. The P-type column regions 106 in the circumferential region are formed with a depth larger than or equal to that of the P-type column regions 106 in the element-forming region.

19 Claims, 8 Drawing Sheets

SEMICONDUCTOR DEVICE AND METHOD OF FABRICATING THE SAME

This application is based on Japanese patent application No. 2005-003803 the content of which is incorporated hereinto by reference.

BACKGROUND

1. Technical Field

The present invention relates to a semiconductor device and a method of fabricating the same, and in particular to a semiconductor device having a super-junction structure and a method of fabricating the same.

2. Related Art

Vertical power MOSFET has been proposed as a high voltage MOS field effect transistor (MOSFET). Important characteristics of this sort of high voltage MOSFET include ON resistance and breakdown voltage resistance. The ON resistance and the breakdown voltage resistance depend on resistivity of an electric field relaxing layer, wherein the ON resistance can be lowered by raising an impurity concentration in the electric field relaxing layer to thereby lower the resistivity, but this concomitantly lowers the breakdown voltage resistance in a trade-off manner.

In recent years, there has been proposed a super-junction structure as a technique of reducing the ON resistance of the high voltage MOSFET while maintaining the breakdown voltage resistance unchanged.

FIG. 7 is a sectional view showing a configuration of a conventional semiconductor device having such super-junction structure. A semiconductor device 10 has a semiconductor substrate 11, an N-type drift region 14, a base region 15, source regions 22 formed in the base region 15, a gate insulating film 20, a gate electrode 18 formed on the gate insulating film 20, an insulating film 24 formed on the gate electrode 18, a source electrode 26, a P-type column region 16, and a drain electrode 12. The N-type drift region 14 is formed on the semiconductor substrate 11 and functions as an electric field relaxing layer. The base region 15 is formed in the surficial portion of the N-type drift region 14. The source electrode 26 is formed on the insulating film 24 so as to be connected with the source regions 22. The P-type column region 16 is formed between two adjacent portions of the gate electrode 18 in the N-type drift region 14. The drain electrode 12 is formed on the back surface of the semiconductor substrate 11.

The semiconductor substrate 11, the N-type drift region 14, and the source region 22 are designed to have the same conductivity type (N-type in this case). The base region 15 and the P-type column regions 16 are configured as having a conductivity type opposite to that of the N-type drift region 14 (P-type in this case). The N-type drift region 14 and the P-type column region 16 are configured as having almost equal dose of the respective impurities.

Next paragraphs will describe operations of thus-configured semiconductor device. When reverse bias voltage is applied between the drain and the source under no bias voltage applied between the gate and the source, a depletion layer expands from two pn junctions between the base region 15 and the N-type drift region 14, and between the P-type column region 16 and the N-type drift region 14, so that current does not flow between the drain and the source, and the device turns off. More specifically, the interface between the P-type column region 16 and the N-type drift region 14 extends in the depth-wise direction, from which the depletion layer extends, so that depletion of the region over a width of d, shown in FIG. 7, means depletion of the entire portion of the P-type column region 16 and the N-type drift region 14.

The breakdown voltage resistance of the semiconductor device can therefore be made independent of concentration of the impurity of the N-type drift region 14 which functions as an electric field relaxing layer, if the P-type column region 16 and the N-type drift region 14 are specified so as to thoroughly shrink the width d. Adoption of the super-junction structure as described in the above makes it possible to maintain the breakdown voltage resistance, while keeping the ON resistance low by raising the concentration of impurity of the N-type drift region 14. Japanese Laid-Open Patent Publication No. 2001-135819 discloses a super-junction semiconductor device having this sort of super-junction structure.

Japanese Laid-Open Patent Publication No. 2003-273355 (FIGS. 1 and 2) discloses a configuration of a semiconductor device having an N-type drift layer and a P-type drift layer formed so as to extend not only to the cell region but also to the vicinity of the circumference of the junction-end region. On the P-type drift layer in the vicinity of the interface with the cell region out of the junction-end region, there is formed a P-type base layer. On the surface of the junction-end region, but except on a part of the P-type base layer, an insulating film is formed, and further on the insulating film, a field electrode is formed so as to surround the cell region, to contact with the surface of the P-type base layer, and to be electrically connected to the source electrode. More specifically, the field electrode is formed on the P-type drift layer in the vicinity of the interface with the cell region out of the junction-end region.

It is to be noted herein that the narrower the pitch of the column regions becomes, the larger the super-junction effect grows. In particular, for those devices having a low voltage resistance between the source and the drain (approximately 100 V or below, for example), it is preferable to form a micro-super-junction structure. The P-type column regions 16 even formed as having a narrow pitch therebetween, however, result in lateral expansion due to diffusion of the impurity contained in the P-type column regions 16 into the N-type drift region 14, if it is exposed to a large thermal history, and this makes it difficult to narrow the pitch.

For the semiconductor device having the micro-super-junction structure, it is therefore necessary to investigate into the process steps of fabrication successfully preventing the semiconductor device from being exposed to thermal stress after formation of the P-type column regions 16.

SUMMARY OF THE INVENTION

According to the present invention, there is provided a semiconductor device including: a first-conductivity-type substrate which includes an element-forming region having a gate electrode formed therein, and a circumferential region formed in the outer periphery of the element-forming region and having an element-isolating region formed therein; a field electrode formed on the circumferential region; and a parallel pn layer having a first-conductivity-type drift region, which is formed on the main surface of the substrate, and second-conductivity-type column regions alternately arranged therein, so as to extend over the element-forming region and a part of the circumferential region, in the circumferential region, at least one of the column regions, formed on the outer circumferential region side as viewed from the end portion of the field electrode on the element-forming region side, being formed with a depth larger than or equal to that of the column regions formed in the element-forming region, and the field electrode being not formed just above the at least one of the column regions formed with a depth larger than or equal to that of the column regions formed in the element-forming region. The field electrode may electrically be connected to the gate electrode.

The configuration obtained herein is such as having no field electrode formed on at least one of column regions, and instead typically having an insulating film or the like directly formed on the field electrode.

According to the present invention, there is also provided a method of fabricating a semiconductor device, which includes forming a field electrode on a circumferential region of a first-conductivity-type substrate having, formed therein, an element-forming region which has a gate electrode formed therein, and a circumferential region formed in the outer periphery of the element-forming region and having the element-isolating region formed therein; selectively removing the field electrode; and forming a parallel pn layer having a first-conductivity-type drift region and second-conductivity-type column regions alternately arranged therein, by implanting a second-conductivity type impurity ion from the main surface of the substrate, in a predetermined region in the element-forming region and below the region from which the field electrode is removed. In the process of selectively removing the field electrode, a portion of the field electrode, which falls on the circumferential region side as viewed from the end portion on the element-forming region side, may selectively removed.

As has previously been described in Japanese Laid-Open Patent Publication No. 2003-273355, the semiconductor device having the N-type drift layer (N-type drift region) and the P-type drift layers (P-type column regions) formed also in the junction-end portion, and having a field electrode formed thereon can be fabricated by any of the procedures below:

(1) the P-type column regions are formed by ion implantation, and then the field electrode is formed thereon; and (2) the field electrode is formed, and ions are implanted through the field electrode, to thereby form the P-type column regions.

As described in the above, it is preferable for the semiconductor device having the micro-super-junction structure to avoid exposure to the thermal history after the P-type columns are formed. The field electrode herein can be formed by forming a polysilicon layer by the CVD process. The semiconductor device in this case is exposed to the thermal history during formation of the polysilicon layer, so that procedure (1) raises difficulty in realizing the micro-super-junction structure, because impurity in the P-type column region undesirably diffuses into the N-type drift region during formation of the field electrode.

It is therefore preferable, as described in procedure (2), to form the P-type column regions after the field electrode is formed. FIG. 8 is a sectional view showing a configuration of a semiconductor device in which the P-type column regions are formed after the field electrode is formed, by implanting ions therethrough.

A semiconductor device 50 has a semiconductor substrate 51, an N-type drift region 54 formed on the semiconductor substrate 51 and functions as an electric field relaxing layer, a base region 55 formed on the N-type drift region 54, a source region 62 formed in the base region 55, a gate insulating film (not shown), gate electrode 58 (and connection electrode 58a connected to the gate electrode 58) formed on the gate insulating film, an insulating film 64 formed on the gate electrode 58, a source electrode 66 formed on the insulating film 64 so as to be connected with the source region 62, P-type column regions 56 (and 56a) formed between every two adjacent portions of the gate electrode 58 in the N-type drift region 54, a drain electrode 52 formed on the back surface of the semiconductor substrate 51, and an element-isolating region 68. The semiconductor device 50 has element-forming region having the gate electrode 58 formed therein, and the circumferential region formed on the outer periphery thereof. The semiconductor device 50 further has a field electrode 70 formed on the semiconductor substrate 51 in the circumferential region. The field electrode 70 is electrically connected through a connection electrode 58a formed in the circumferential region to the gate electrode 58. The field electrode 70 herein is formed almost over the entire surface of the circumferential region so as to ensure electrical connection with the connection electrode 58a.

The P-type column regions 56 are formed by implanting a P-type impurity ion into the semiconductor substrate 51, through a mask having predetermined openings. Because there is already formed the field electrode 70, the impurity ion is implanted through the field electrode 70 in the circumferential region. The depth of the P-type column regions 56a therefore becomes smaller than that of the P-type column regions 56 in the element-forming region. The super-junction effect depends also on the depth of the P-type column regions, and becomes larger as the depth increases.

If the depth of the P-type column regions 56a in the circumferential region is smaller than that of the P-type column regions 56 in the element-forming region as shown in FIG. 8, the voltage resistance of the circumferential region becomes lower than that of the element-forming region, so that the overall voltage resistance of the semiconductor device 50 is inevitably governed by the voltage resistance of the circumferential region. It is therefore impossible to improve the overall voltage resistance of the semiconductor device 50, even if elements in the element-forming region are fabricated while controlling various conditions for higher voltage resistance. From this point of view, it is necessary to fabricate the semiconductor device so that the circumferential region can maintain the voltage resistance not smaller than that of the element-forming region.

The semiconductor device of the present invention, of which column regions are formed after the field electrode is formed, can prevent the semiconductor device from being exposed to the thermal history after formation of the column regions. This makes it possible to form the micro-super-junction structure. Because the field electrode in the circumferential region is not formed on the region where the column regions are formed later, it is made possible to form the column regions, also in the circumferential region, so as to have the depth equivalent to or larger than the depth of the column regions in the element-forming region. This makes it possible to prevent the voltage resistance of the circumferential region from being degraded.

According to the present invention, it is made possible to improve the super-junction effect of the semiconductor device having the super-junction structure, and to prevent degradation in the voltage resistance.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1A:
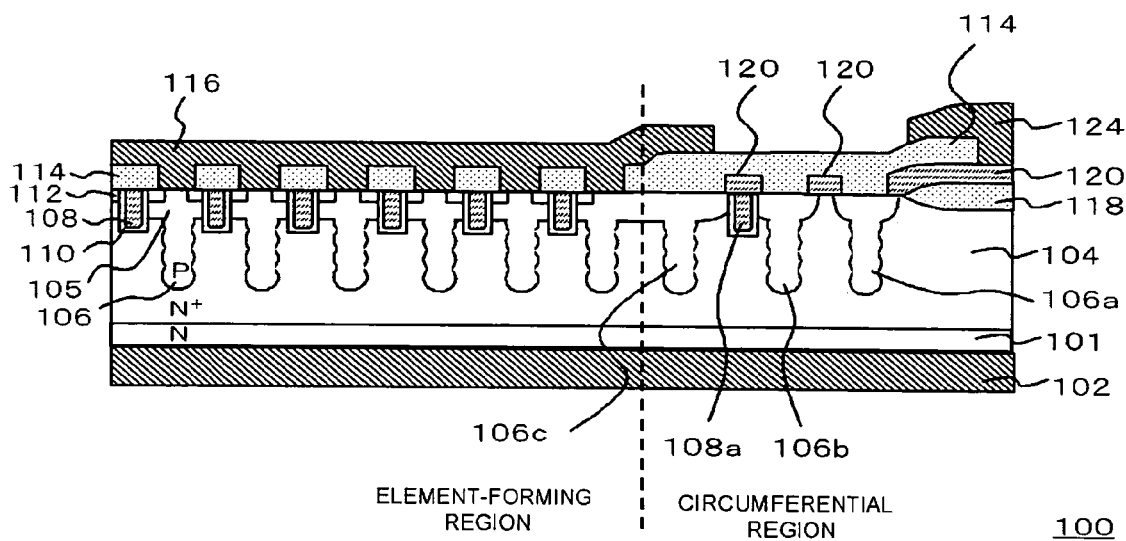
FIGS. 1A and 1B are drawings showing a configuration of a semiconductor device of an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the embodiments described below, any identical constituents will be given with the same reference numeral, allowing omission of explanation on occasions. In the embodiments below, the description will be made on the case where the first conductivity type is N-type, and the second conductivity type is P-type.

First Embodiment

Figure 1B:
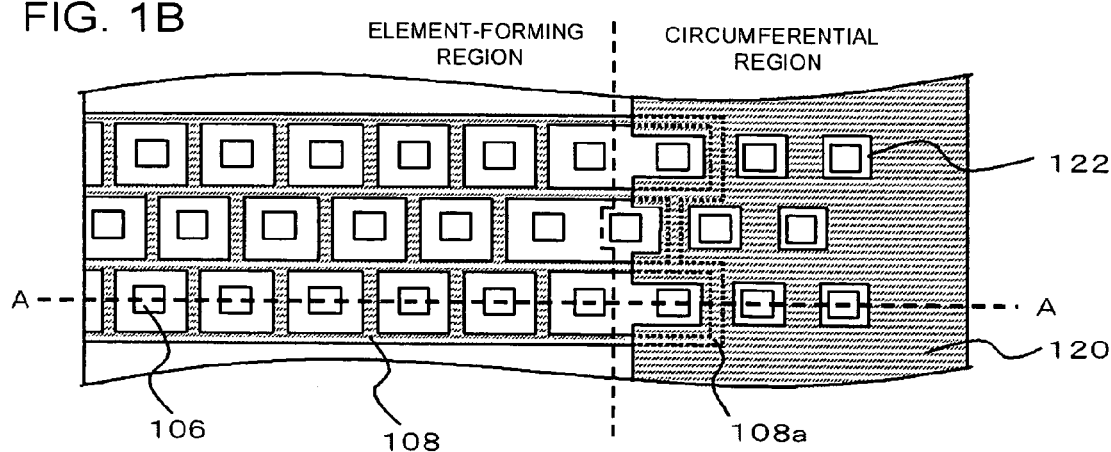

FIGS. 1A and 1B are drawings showing a configuration of the semiconductor device of the first embodiment.

FIG. 1A is a sectional view showing configuration of a semiconductor device 100 of the first embodiment.

The semiconductor device 100 contains a trench-gate-type vertical power MOSFET. The semiconductor device 100 has a semiconductor substrate 101, an N-type drift region 104, a base region 105, source regions 112 formed in the base region 105, a gate insulating film 110, a gate electrode 108 formed on the gate insulating film 110, an insulating film 114 formed on the gate electrode 108, a source electrode 116, P-type column regions 106, a drain electrode 102, and an element-isolating region 118. The semiconductor substrate 101 functions as a drain region. The N-type drift region 104 is formed on the semiconductor substrate 101 and functions as an electric field relaxing layer. The base region 105 is formed in the surficial portion of the N-type drift region 104. The source electrode 116 is formed on the insulating film 114 so as to be connected with the source regions 112. The P-type column regions 106 are formed between two adjacent portions of the gate electrode 108 in the N-type drift region 104. The drain electrode 102 is formed on the back surface of the semiconductor substrate 101. The semiconductor device 100 has a parallel pn layer having the N-type drift region 104 and the P-type column regions 106 alternately arranged therein. The semiconductor substrate 101 and the N-type drift region 104 formed by epitaxial growth compose the substrate. These constituents are generally referred to as "substrate" hereinafter. In the first embodiment, the gate electrode 108 is a trench gate buried in the substrate.

The semiconductor substrate 101, the N-type drift region 104 and the source region 112 in this case are configured as having the same conductivity type (N-type herein). The base region 105 and the P-type column regions 106 are configured as having the conductivity type opposite to that of the N-type drift region 104 (P-type herein). The N-type drift region 104 and the P-type column regions 106 are configured as having almost equal dose of the respective impurities.

The semiconductor device 100 has an element-forming region having transistors formed therein, and a circumferential (peripheral) region formed so as to surround the element-forming region and having the element-isolating region 118 formed therein. The P-type column regions 106 are formed in the element-forming region and in a part of the circumferential region. The semiconductor device 100 further has a field electrode 120 formed in the circumferential region, and an electrode 124 formed on the field electrode 120 in the circumferential region. The field electrode 120 generally functions as a field plate electrode formed in the circumferential region around the elements of a high voltage semiconductor device, and also functions as a gate finger connecting the electrode 124 and the gate electrode 108. In the first embodiment, the field electrode 120 is not formed just above the P-type column regions 106 (106a, 106b and 106c) formed in the circumferential region. The field electrode 120 is electrically connected also to a connection electrode 108a in the circumferential region, and further connected through the connection electrode 108a to the gate electrode 108. The insulating film 114 is formed also on the field electrode 120 in the circumferential region.

In the first embodiment, a plurality of P-type column regions 106 (106a, 106b and 106c) are formed in the circumferential region. The voltage resistance of the circumferential region may be maintained at a high level, by thus forming a plurality of P-type column regions 106 in the circumferential region. In the first embodiment, the P-type column regions 106 (106a, 106b and 106c) formed in the circumferential region have a depth substantially same with that of the P-type column regions 106 formed in the element-forming region. In the first embodiment, all of the P-type column regions 106 have a substantially same impurity profile.

FIG. 1B is a top view showing a configuration of the semiconductor device 100 of the first embodiment. The drawing herein shows a configuration containing only the P-type column regions 106, the gate electrode 108 and the field electrode 120 for the convenience of explanation.

In the first embodiment, the P-type column regions 106 are formed in an island-like manner according to a two-dimensional staggered arrangement. The field electrode 120 has, in the circumferential region, a plurality of openings 122 which open respectively on the plurality of column regions 106, and are formed in an island-like manner. In another word, the field electrode 120 has the openings 122 which open on the P-type column regions 106 formed on the circumferential region side as viewed from the end portion of the field electrode 120 on the element-forming region side. The gate electrode 108 is connected through the connection electrode 108a formed on the circumferential region to the field electrode 120. The field electrode 120 has the openings 122 positioned on the circumferential region side as viewed from the site of connection between the connection electrode 108a and the field electrode 120. It is to be noted that FIG. 1A is a sectional view taken along line A-A in FIG. 1B.

Figure 2A:
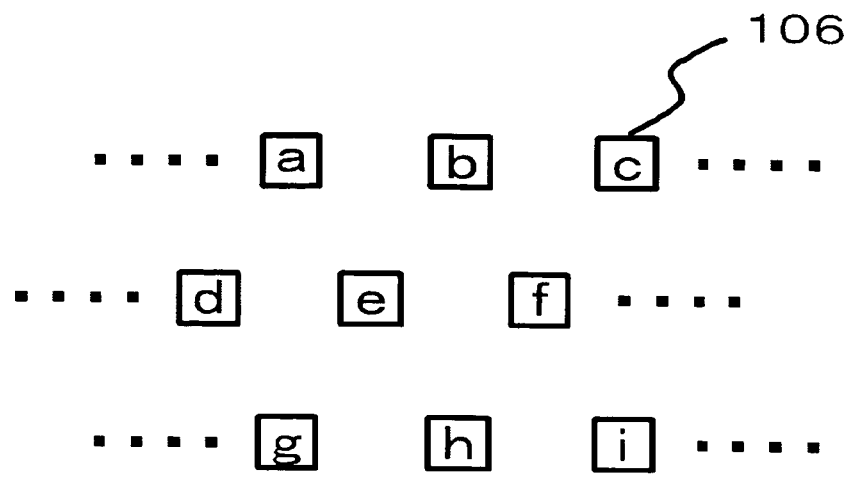
FIGS. 2A and 2B are drawings showing arrangements of the P-type column regions.
Figure 2B:
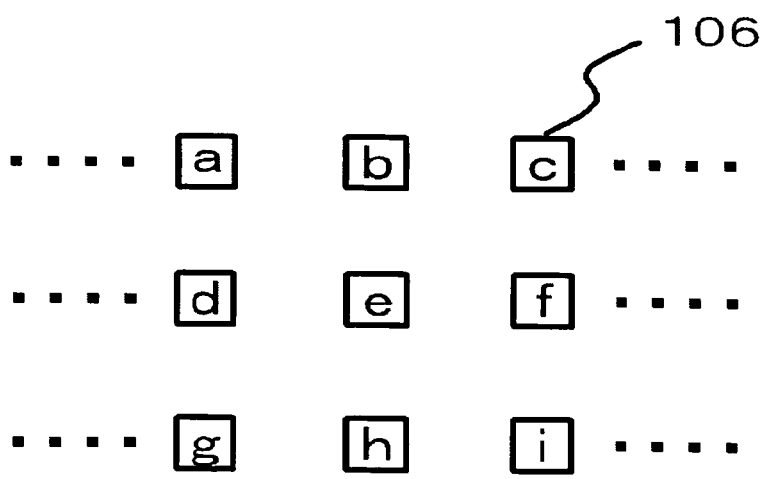

FIGS. 2A and 2B are drawings showing states of arrangement of the P-type column regions 106.

FIG. 2A shows a state of arrangement of the P-type column regions 106 of the semiconductor device 100 according to the first embodiment. As shown in the drawing, such two-dimensional arrangement of the P-type column regions 106 according to a two-dimensional staggered arrangement makes it possible to arrange the island-like P-type column regions 106 at almost regular intervals. On the other hand, the arrangement shown in FIG. 2B, in which the P-type column regions 106 are arranged as being aligned both in the longitudinal direction and the transverse direction, causes difference between the distance of the P-type column region 106 marked with "e" from those marked with "b", "d", "f" and "h", and the distance from those marked with "a", "c", "g" and "i". Arrangement of the island-like, P-type column regions 106 at almost regular intervals makes it possible to equalize the distance between each of the P-type column regions 106 and the N-type drift region 104 (see FIG. 1A) over the entire region, and to thereby allow the super-junction effect to fully exhibit.

There is no specific limitation on the state of arrangement of the P-type column regions 106, and the configuration shown in FIG. 2B may be allowable, but it is more preferable to adopt the configuration shown in FIG. 2A.

Figure 3A:
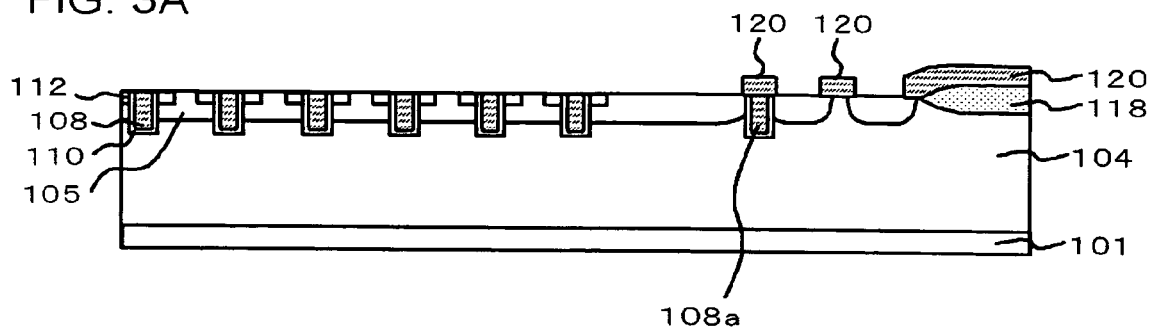
FIGS. 3A to 3C are sectional views showing process steps of fabricating the semiconductor device of the embodiment.
Figure 3B:
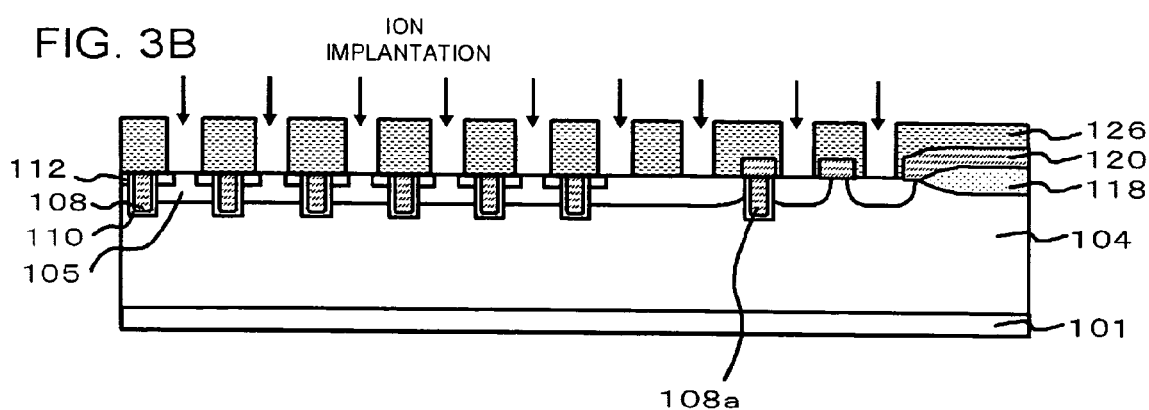
Figure 3C:
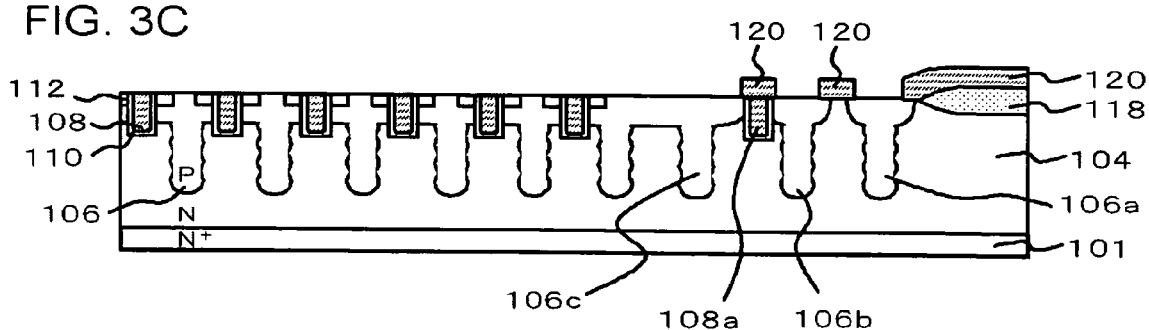

Next, process steps of fabrication of the semiconductor device 100 of the first embodiment will be described. FIGS. 3A to 3C are sectional views showing process steps of fabricating the semiconductor device 100 of the first embodiment.

First, on the main surface of the high-concentration, N-type semiconductor substrate 101, silicon is epitaxially grown while typically doping phosphorus (P) thereinto, to thereby form the N-type drift region 104. On the surface of the N-type drift region 104 in the circumferential region, the element-isolating region 118 is then formed. The element-isolating region 118 can be formed by the LOCOS (local oxidation of silicon) process.

Next, boron (B) ion, for example, is implanted into the surficial portion of the N-type drift region 104 to thereby form the base region 105.

The surface of the N-type drift region 104 is then selectively etched by a photolithographic technique, to thereby form a trench. A silicon oxide film is then formed by thermal oxidation on the inner wall of the trench and on the surface of the N-type drift region 104. Potion of the silicon oxide film formed on the surface of the N-type drift region 104 is then removed. Next, a polysilicon layer is formed in the trench and on the surface of the N-type drift region 104, by the CVD (chemical vapor deposition) process. Then using a photolithographic technique, portion of the polysilicon is selectively removed by etchback, so as to leave the polysilicon layer only in the trench and in the predetermined region on the surface of the substrate. The gate electrode 108, the connection electrode 108a and the field electrode 120, having the pattern shown in FIG. 1B, are thus formed.

Next, using a photolithographic technique, arsenic (As) ion for example is implanted to thereby form the N-type source regions 112 around the gate electrode 108 on the surface of the base region 105. The configuration shown in FIG. 3A is obtained by these procedures.

Next, a mask 126 having a predetermined pattern is formed, and boron (B) ion for example is implanted through the mask 126 into the surficial portion of the N-type drift region 104 (FIG. 3B). The ion implantation herein can be carried out as being divided into a multiple number of times while varying the energy for the respective times. The mask 126 is then removed by etching (FIG. 3C). In the first embodiment, the P-type column regions 106 are formed not so deeply as reaching the semiconductor substrate 101 which functions as the drain region.

Next, the insulating film 114 is formed on the surface of the N-type drift region 104 and patterned to obtain a predetermined geometry. An electrode layer is then formed by sputtering typically using an aluminum target. The electrode layer is then patterned to obtain a predetermined geometry, to thereby form the source electrode 116 and the electrode 124. The drain electrode 102 is formed on the back surface of the N-type drift region 104 by a similar sputtering process. The semiconductor device 100 having a configuration shown in FIG. 1A is thus obtained.

The first embodiment is characterized by forming the field electrode 120 before the P-type column regions 106 are formed, but there are no specific limitations on any other procedures, such that which of the base region 105, the source region 112 and the field electrode 120 should be formed earlier. These components may be formed according to an order of procedures different from that described in the above.

According to the procedures of fabricating the semiconductor device 100 of the first embodiment, the P-type column regions 106 are formed after the field electrode 120 is formed, so that the semiconductor device 100 is successfully prevented from being exposed to thermal history after formation of the P-type column regions 106. This make it possible to fabricate the micro-super-junction structure. Because the field electrode 120 in the circumferential region is formed so as to have the openings on the regions where the P-type column regions 106 are formed, the P-type column regions 106 can be formed also in the circumferential region with a depth equivalent to that of the P-type column regions 106 in the element-forming region. This makes it possible to prevent the voltage resistance of the circumferential region from degrading.

Second Embodiment

Figure 4:
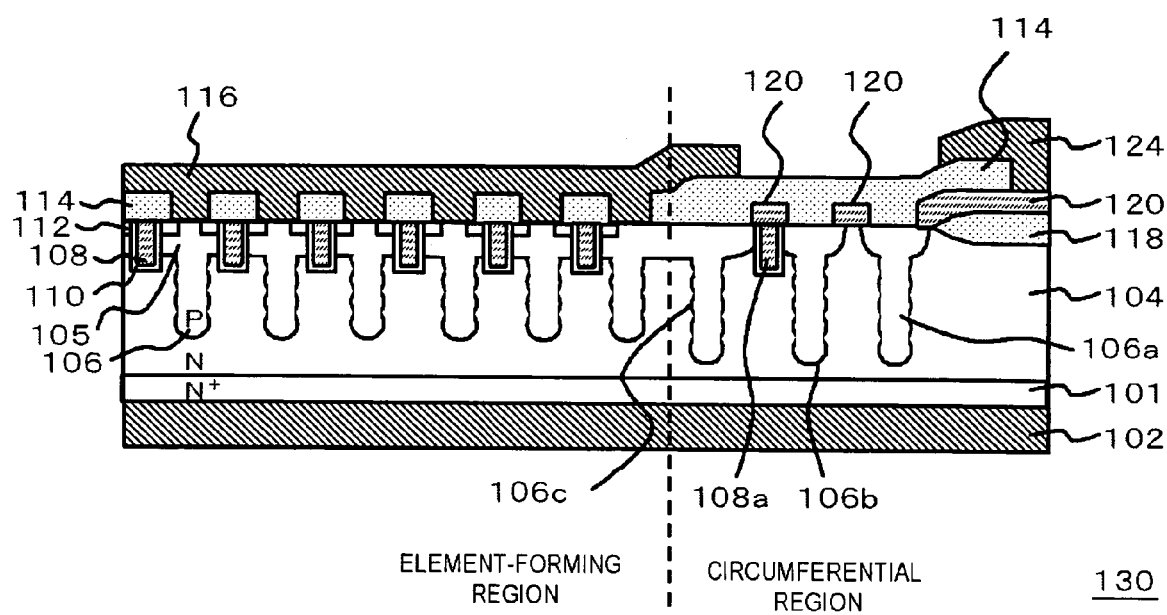
FIG. 4 is a drawing showing a configuration of a semiconductor device of another embodiment.

FIG. 4 is a drawing showing a configuration of a semiconductor device of the second embodiment.

In the second embodiment, a semiconductor device 130 differs from the semiconductor device 100 of the first embodiment in that the depth of the P-type column regions 106 (106a, 106b and 106c) formed in the circumferential region is larger than that of the P-type column regions 106 formed in the element-forming region.

By making the depth of the P-type column regions 106 formed in the circumferential region larger than that of the P-type column regions 106 formed in the element-forming region, it is made possible to control the voltage resistance of the semiconductor device 130 by the voltage resistance of the element-forming region.

The semiconductor device 130 of the second embodiment can be fabricated by the procedures basically same as those fabricating the semiconductor device 100 described referring to FIGS. 3A to 3C in the first embodiment. In the second embodiment, the configuration shown in FIG. 3A is first fabricated, and then boron (B) ion for example is implanted under a large energy through a mask formed on the circumferential region so as to have openings corresponding only to the P-type column regions 106 to be formed in the circumferential region. The deepest portions of the P-type column regions 106 (106a, 106b and 106c) in the circumferential region are thus formed. The mask is then removed, and using a mask same as the mask 126 described in FIG. 3B of the first embodiment, the P-type column regions 106 are formed both in the element-forming region and the circumferential region. Energy of the ion implantation herein is lowered from that under which the deepest portions of the P-type column regions 106 were formed in the circumferential region. The semiconductor device 130 configured as shown in FIG. 4 is thus obtained.

Third Embodiment

Figure 5A:
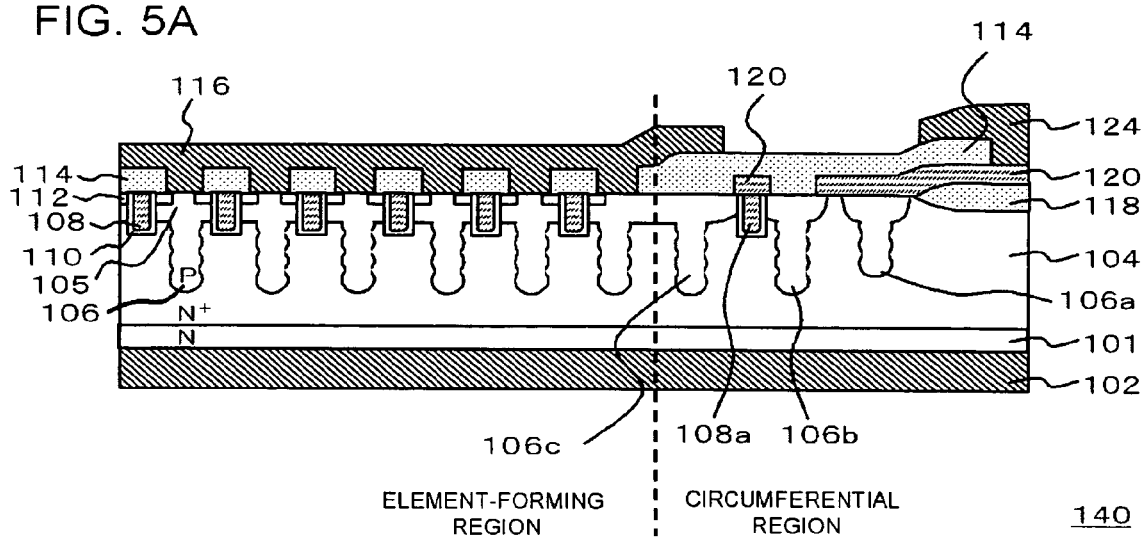
FIGS. 5A and 5B are drawings showing a configuration of a semiconductor device of another embodiment.
Figure 5B:
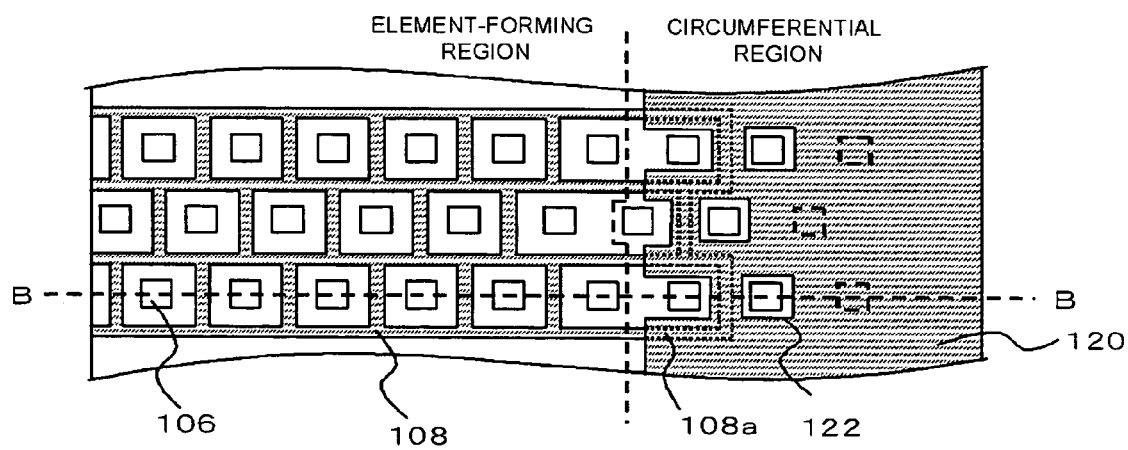

FIGS. 5A and 5B are drawings showing a configuration of a semiconductor device of the third embodiment. FIG. 5A is a sectional view showing a configuration of a semiconductor device 140 of the third embodiment. FIG. 5B is a top view of the semiconductor device 140. It is to be noted that FIG. 5A is a sectional view taken along line B-B in FIG. 5B.

The semiconductor device 140 of the third embodiment differs from the semiconductor device 100 of the first embodiment in that the P-type column regions 106 (106a) formed at the outermost position in the circumferential region have a depth smaller than that of the other P-type column regions 106.

The element-isolating region 118 is formed in the vicinity of the P-type column regions 106 (referred to as outermost P-type column regions 106a hereinafter) formed on the outermost portion of the circumferential region.

In the semiconductor device 140, electric flux is kept constant between the N-type drift region 104 and the element-isolating region 118. Because the relation of (electric flux D)=(dielectric constant ϵ)×(electric field E) holds, electric field E under a constant electric flux becomes larger as the dielectric constant ϵ becomes smaller. On the other hand, breakdown voltage V of a certain film is given as V=E×t, where t is the thickness of the film. Under assumption of a constant film thickness t, a smaller dielectric constant ϵ results in a larger voltage resistance.

Because the element-isolating region 118 is smaller in the dielectric constant as compared with the N-type drift region 104, the outermost P-type column regions 106a formed in the vicinity of the element-isolating region 118 can realize the voltage resistance equivalent to that of the other P-type column regions 106, even if the depth is made shallower than that of the other P-type column regions 106.

The semiconductor device 140 of the third embodiment can be fabricated by the procedures basically same as those described referring to FIGS. 3A to 3C in the first embodiment. The third embodiment differs from the first embodiment in that, when the polysilicon layer is selectively removed, the polysilicon layer is left unremoved in the regions where the outermost P-type column regions 106 (106a) are to be formed. Thereafter the semiconductor device 140 can be fabricated by the procedures same as those described in the first invention. In the third embodiment, the outermost P-type column regions 106 (106a) are formed shallower than the other P-type column regions 106 in other region, because the ion implantation is effected through the field electrode 120 which has previously been formed. The semiconductor device 140 configured as shown in FIG. 5A is thus formed.

Also in the third embodiment, it is also allowable to selectively remove the field electrode 120 on the outermost P-type column regions 106 (106a). In this configuration, boron (B) ion for example is implanted into the surficial portion of the N-type drift region 104 under a large energy, through a mask having openings only in the regions corresponded to the P-type column regions 106 other than the outermost P-type column regions 106 (106a). The deepest portions of the P-type column regions 106 in the element-forming region and of the P-type column regions 106 (106b and 106c) in the inner portion of the circumferential region are thus formed. The mask is then removed, and using a mask same as the mask 126 described in the first embodiment, the P-type column regions 106 are formed both in the element-forming region and the entire portion of the circumferential region. Energy of the ion implantation herein is lowered from that under which the deepest portions of the P-type column regions 106 in the element-forming region and so forth were formed, and is varied in a gradual manner.

In another embodiment, the outermost P-type column regions 106a may be formed just under the element-isolating region 118. The depth $t_{sj}$ of the outermost P-type column regions 106a can be adjusted so as to satisfy the relation below:

$$t_{sj}' - t_{sj} < (2\epsilon_{si}/\epsilon_{ox}) \times t_{ox} \quad \text{(formula 1)}$$

where, $t_{sj}'$ represents the depth of the P-type column regions 106 (referred to as adjacent P-type column regions 106b hereinafter) adjacent to the outermost P-type column regions 106a, $t_{ox}$ represents a mean thickness of the element-isolating region 118, $\epsilon_{ox}$ represents the dielectric constant of the element-isolating region 118, and $\epsilon_{si}$ represents the dielectric constant of the N-type drift region 104 just under the element-isolating region 118.

The above formula can be transformed as below:

$$t_{sj} > t_{sj}' - (2\epsilon_{si}/\epsilon_{ox}) \times t_{ox} \quad \text{(formula 2)}$$

As described in the above, the semiconductor device 140 of the third embodiment can be configured so that the field electrode is not formed on all of the P-type column regions 106 at least other than the P-type column regions 106 formed in contact with the element-isolating region 118 and the P-type column regions 106 formed in adjacent to the element-isolating region 118. As described in the above, the P-type column regions 106 located just under the element-isolating region 118 or in the vicinity thereto can maintain the voltage resistance at a level equivalent to that of the other regions, despite of the depth of which shallower than that of the other regions, by virtue of contribution by the dielectric constant of the element-isolating region 118. Also the semiconductor device 140 as configured according to the third embodiment can maintain the voltage resistance at a desirable level.

For the P-type column regions 106 formed just under the element-isolating region 118, the ion implantation forming such P-type column regions 106 is effected through the element-isolating region 118, so that the depth of the P-type column regions 106 may become shallower than those in other regions even if the element-isolating region 118 has no field electrode 120 formed thereon. Even in such case, the semiconductor device 140 can maintain the voltage resistance at a level equivalent to that in the other regions, by virtue of contribution of the dielectric constant of the element-isolating region 118.

Fourth Embodiment

Figure 6A:
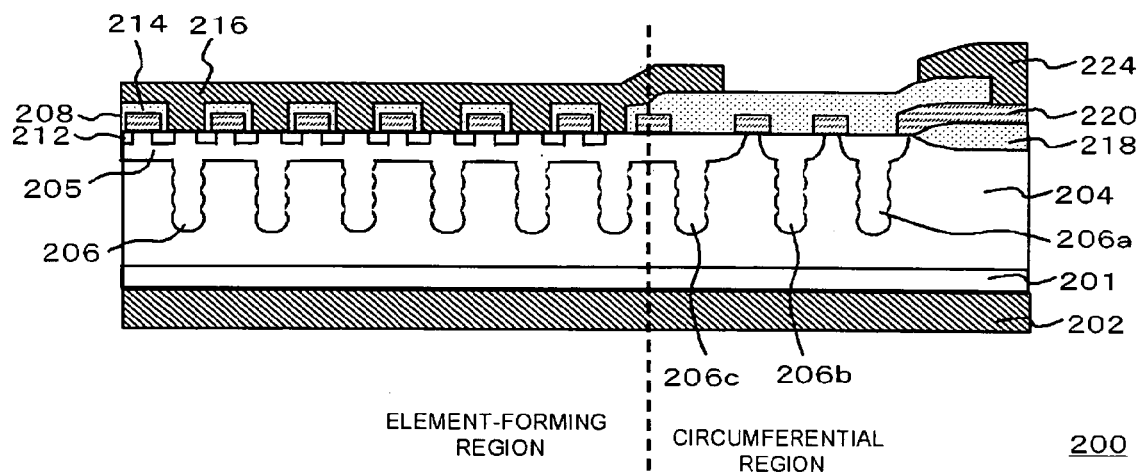
FIGS. 6A and 6B are drawings showing a configuration of a semiconductor device of another embodiment.
Figure 6B:
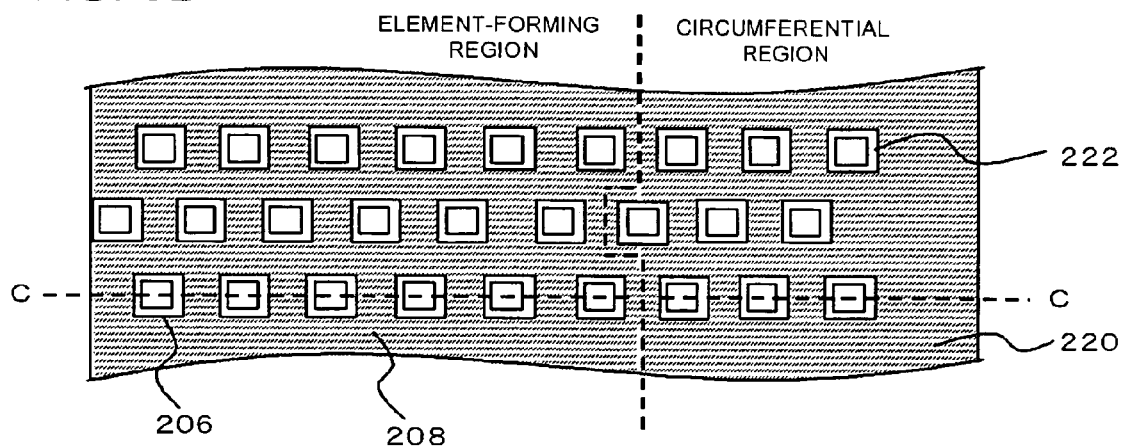
Figure 7:
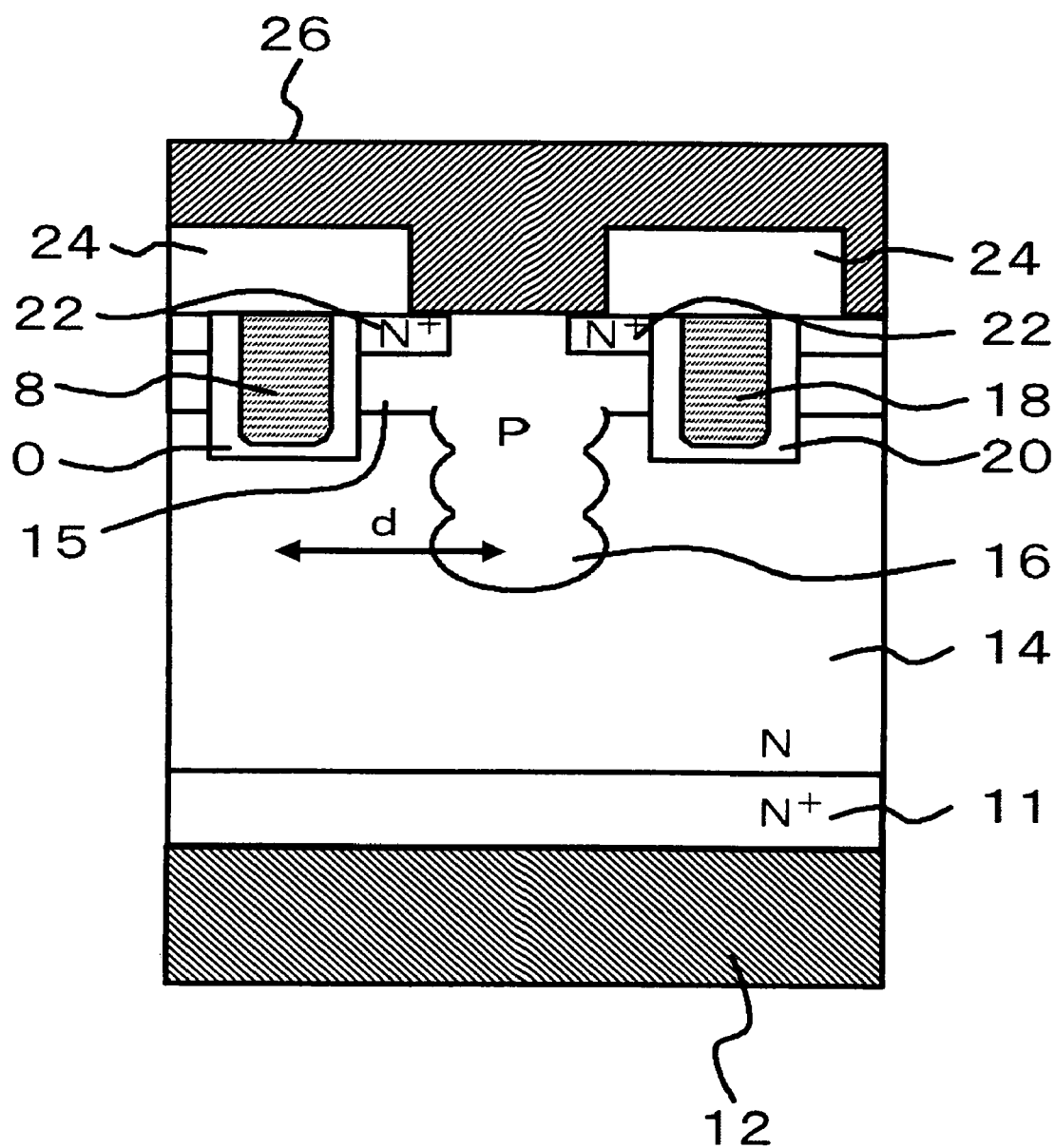
FIG. 7 is a sectional view showing a configuration of a conventional semiconductor device having the super-junction structure.
Figure 8:
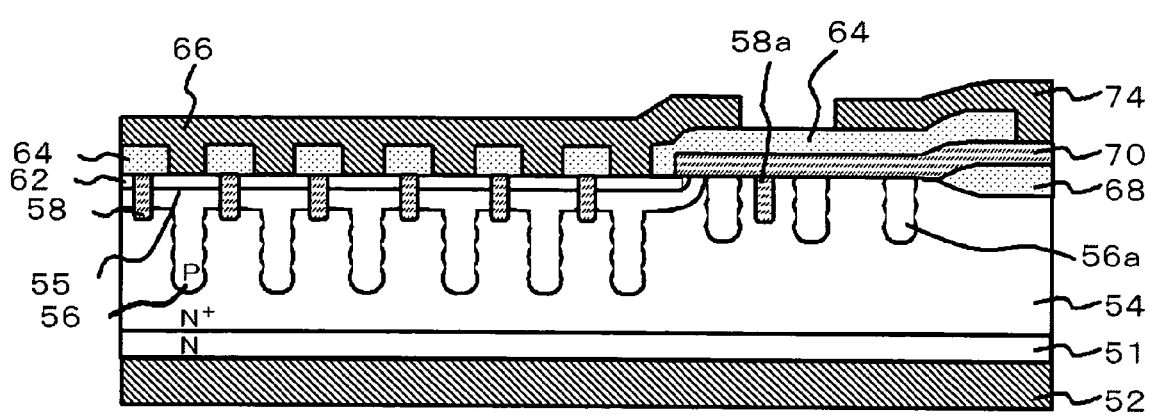
FIG. 8 is a sectional view showing a configuration of a semiconductor device having the P-type column regions formed after the field electrode was formed, by implanting ions through the field electrode.

FIGS. 6A and 6B are drawings showing a configuration of a semiconductor device of the fourth embodiment.

FIG. 6A is a sectional view showing a configuration of a semiconductor device 200 of the fourth embodiment.

The semiconductor device 200 has a semiconductor substrate 201, an N-type drift region 204, a base region 205, a gate electrode 208 formed on the source region 212, an insulating film 214 formed on the gate electrode 208, a source electrode 216, P-type column regions 206, a drain electrode 202, and an element-isolating region 218. The N-type drift region 204 is formed on the semiconductor substrate 201 and functions as an electric field relaxing layer. The base region 205 is formed in the surficial portion of the N-type drift region 204. The source electrode 216 is formed on the insulating film 214 so as to be connected with the source region 212. The P-type column regions 206 are formed between two adjacent portions of the gate electrode 208 in the N-type drift region 204. The drain electrode 202 is formed on the back surface of the semiconductor substrate 201.

The semiconductor device 200 has the element-forming region having transistors formed therein, and the circumferential region formed so as to surround the element-forming region and has the element-isolating region 218 formed therein. The P-type column regions 206 are formed in the element-forming region and in a part of the circumferential region. The semiconductor device 200 further has a field electrode 220 formed over the element-isolating region 218 towards the element-forming region, and an electrode 224 formed on the field electrode 220. The insulating film 214 is also formed on the field electrode 220 in the circumferential region.

The semiconductor substrate 201, the N-type drift region 204, and the source region 212 are configured as having the same conductivity type (N-type in this case). The base region 205 and the P-type column regions 206 are configured as having the conductivity type opposite to that of the N-type drift region 204 (P-type in this case). The N-type drift region 204 and the P-type column regions 106 are configured as having almost equal dose of the respective impurities.

In the fourth embodiment, the P-type column regions 206 (206a, 206b and 206c) formed in the circumferential region have a depth substantially same with that of the P-type column regions 206 formed in the element-forming region. In the fourth embodiment, all of the P-type column regions 206 have a substantially same impurity profile.

FIG. 6B is a top view showing a configuration of the semiconductor device 200 of the fourth embodiment. The drawing herein shows a configuration containing only the P-type column regions 206, the gate electrode 208 and the field electrode 220 for the convenience of explanation.

The P-type column regions 206 in the fourth embodiment are formed in an island-like manner, and are arranged at almost regular intervals from each other. The gate electrode 208 and the field electrode 220 have openings 222 formed therein so as to be opened on the P-type column regions 206. The gate electrode 208 and the field electrode 220 are formed with a continuous lattice pattern surrounding the island-like, P-type column regions 206. It is to be noted that FIG. 6A is a sectional view taken along line C-C in FIG. 6B.

Also in the fourth embodiment, the P-type column regions 206 can be formed after the field electrode 220 was formed. This successfully prevents the semiconductor device 200 from being exposed to thermal history after formation of the P-type column regions 206. This makes it possible to fabricate the micro-super-junction structure. Because the field electrode 220 in the circumferential region is formed so as to have the openings on the regions where the P-type column regions 206 are formed, the P-type column regions 206 can be formed also in the circumferential region with a depth equivalent to that of the P-type column regions 206 in the element-forming region. This makes it possible to prevent the voltage resistance of the circumferential region from degrading.

The foregoing paragraphs have described the present invention referring to the embodiments. These embodiments are merely for exemplary purposes, and it is to be understood by those skilled in the art that combination of the individual components and process steps may be modified in various ways, and that such modifications are also within the scope of the present invention.

The above-described embodiments have exemplified the cases in which the first conductivity type is N-type and the second conductivity type is P-type, wherein it is also allowable to define the first conductivity type as P-type and the second conductivity type as N-type.

The above-described embodiments have shown the cases in which the individual P-type column regions are two-dimensionally arranged according to a dot pattern, wherein the P-type column regions may have a variety of other arrangement. For example, the individual P-type column regions may two-dimensionally be arranged according to a line pattern. Also in this case, the regions having the individual P-type column regions formed later may have no field electrode formed therein.

For example, it is also allowable to configure the P-type column region 106 formed in the element-forming region and the outermost P-type column regions 106a as having a substantially equal depth, and to configure the P-type column regions 106 (106b and 106c) other than the outermost P-type column regions 106a formed in the circumferential region as having a depth larger than that of the P-type column regions 106. Also this configuration makes it possible to ensure the voltage resistance of the circumferential region larger than that of the element-forming region. Similarly to as shown in the third embodiment, it is allowable to set the depth of the outermost P-type column regions 106a smaller than that of the P-type column regions 106 formed in the element-forming region, and to set the depth of the P-type column regions 106 (106b and 106c), other than the outermost P-type column region 106a, formed in the circumferential region larger than that of the P-type column regions 106 formed in the element-forming region. As is clear from the above, it is allowable to appropriately set the depth of the P-type column regions 106 in the individual regions without departing from the spirit of the present invention.

Also in the semiconductor device 200 configured as shown in the fourth embodiment, it is allowable to appropriately set the depth of the P-type column regions 206 in the individual regions.

It is apparent that the present invention is not limited to the above embodiment, and may be modified and changed without departing from the scope and spirit of the invention.

What is claimed is:

1. A semiconductor device comprising:
a first-conductivity-type substrate which includes an element-forming region having a gate electrode formed therein, and a peripheral region formed in the outer periphery of said element-forming region and having an element-isolating region formed therein;
a field electrode formed on said peripheral region; and
a parallel pn layer having a first-conductivity-type drift region, which is formed on the main surface of said substrate, and second-conductivity-type column regions dispersed in said first-conductivity-type drift region, said parallel pn layer extending oversaid element-forming region and a part of said peripheral region, in said peripheral region, at least one of said column regions, formed on an outer portion as viewed from an edge of the field electrode on said element-forming region side, being formed with a depth larger than or equal to that of said column regions formed in said element-forming region, and said field electrode being not formed just above said at least one of said column regions formed with a depth larger than or equal to that of said column regions formed in said element-forming region, wherein said field electrode has a plurality of openings which open respectively on said plurality of column regions, and are formed in an island-like manner.

2. The semiconductor device as claimed in claim 1, wherein said column regions are formed, in an island-like manner according to a two-dimensional staggered arrangement.

3. The semiconductor device as claimed in claim 1, wherein said gate electrode is a trench electrode buried in said substrate, electrically connected to said field electrode, and said at least one of said column regions formed with a depth larger than or equal to that of said column regions formed in said element-forming region is placed on the peripheral region side as viewed from a site of connection between said gate electrode and said field electrode.

4. The semiconductor device as claimed in claim 1, wherein said field electrode is formed, at least, on none of said column regions other than those formed in contact with said element-isolating region and those formed in adjacent to said element-isolating region.

5. A semiconductor device, comprising:
a first-conductivity-type substrate which includes an element-forming region having a gate electrode formed therein, and a peripheral region formed in the outer periphery of said element-forming region and having an element-isolating region formed therein;
a field electrode formed on said peripheral region; and
a parallel pn layer having a first-conductivity-type drift region, which is formed on the main surface of said substrate, and second-conductivity-type column regions dispersed in said first-conductivity-type drift region, said parallel pn layer extending over said element-forming region and a part of said peripheral region, in said peripheral region, at least one of said column regions, formed on an outer portion as viewed from an edge of the field electrode on said element-forming region side, being formed with a depth larger than or equal to that of said column regions formed in said element-forming region, and said field electrode being not formed just above said at least one of said column regions formed with a depth larger than or equal to that of said column regions formed in said element-forming region, wherein said field electrode has a plurality of openings which open respectively on, at least, all of said column regions other than those formed in contact with said element-isolating region and those formed in adjacent to said element-isolating region.

6. The semiconductor device as claimed in claim 1, wherein, at least, all of said column regions other than those formed in contact with said element-isolating region and those formed in adjacent to said element-isolating region have a substantially same depth.

7. The semiconductor device as claimed in claim 1, wherein, at least, all of said column regions other than those formed in contact with said element-isolating region and those formed in adjacent to said element-isolating region have a substantially same impurity profile.

8. The semiconductor device as claimed in claim 1, wherein said column regions formed in said peripheral region have a depth larger than that of the column regions formed in said element-forming region.

9. The semiconductor device as claimed in claim 1, further comprising a drain region formed on the back surface of said substrate, and
at least in said element-forming region, said column regions are formed not so deeply as reaching said drain region.

10. A semiconductor device comprising:
a first-conductivity-type substrate arranged as a drain region;
a parallel pn layer having a first-conductivity type drift region extending continuously on a main surface of said substrate;
a first part of said substrate and said drift region defining an element-forming region;
an adjacent second part of said substrate and said drift region defining a peripheral region formed in the outer periphery of said element-forming region,
said parallel pn layer extending over said element-forming region and a part of said peripheral region;
a gate electrode formed in said element-forming region and extending into said drift region;
an element-isolating region formed in said peripheral region;
second-conductivity-type column regions dispersed in said first-conductivity-type drift region within both said element-forming region and said peripheral region,
each said column region extending toward the main surface of said substrate; and
a field electrode formed over said element isolating region and in electrical contact with said gate electrode; and
an insulating film formed over a portion of said field electrode,
at least one of said column regions, formed on an outer portion as viewed from an edge of said field electrode on said element-forming region side, being formed with a depth larger than or equal to that of said column regions formed in said element-forming region, and
said field electrode being not formed just above at least one of said column regions formed in said peripheral region.

11. The semiconductor device as claimed in claim 10, wherein,
at least one gate electrode formed in said peripheral region, and
said field electrode extending over and contacting said at least one gate electrode formed in said peripheral region.

12. The semiconductor device as claimed in claim 10, wherein said field electrode has a plurality of openings which open respectively over said column regions formed within said peripheral region.

13. The semiconductor device as claimed in claim 10, wherein said field electrode has a plurality of openings which open respectively on said plurality of column regions, and are formed in an island-like manner.

14. The semiconductor device as claimed in claim 10, wherein said gate electrode is a trench electrode, electrically connected to said field electrode.

15. The semiconductor device as claimed in claim 10, wherein said field electrode is formed, at least, on none of said column regions other than those formed in contact with said element-isolating region and those formed in adjacent to said element-isolating region.

16. The semiconductor device as claimed in claim 10, wherein said field electrode has a plurality of openings which open respectively on, at least, all of said column regions other than those formed in contact with said element-isolating region and those formed in adjacent to said element-isolating region.

17. The semiconductor device as claimed in claim 10, wherein, at least, all of said column regions other than those formed in contact with said element-isolating region and those formed in adjacent to said element-isolating region have a substantially same depth.

18. The semiconductor device as claimed in claim 10, wherein, at least, all of said column regions other than those formed in contact with said element-isolating region and those formed in adjacent to said element-isolating region have a substantially same impurity profile.

19. The semiconductor device as claimed in claim 10, further comprising:

a drain region formed on the back surface of said substrate, and at least in said element-forming region, said column regions are formed not so deeply as reaching said drain region.

* * * * *